(12) United States Patent
Droes et al.

(10) Patent No.: US 7,466,011 B2
(45) Date of Patent: Dec. 16, 2008

(54) CLEAVED SILICON SUBSTRATE ACTIVE DEVICE

(75) Inventors: Steven R. Droes, Camas, WA (US); Yutaka Takafuji, Nara (JP)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/600,699

(22) Filed: Nov. 16, 2006

(65) Prior Publication Data

US 2007/0066035 A1  Mar. 22, 2007

Related U.S. Application Data

(60) Division of application No. 10/991,120, filed on Nov. 16, 2004, now Pat. No. 7,183,179, which is a continuation-in-part of application No. 10/953,938, filed on Sep. 28, 2004, now Pat. No. 7,179,719.

(51) Int. Cl.
*H01L 21/30* (2006.01)
(52) U.S. Cl. .................. 257/617; 438/455; 438/458
(58) Field of Classification Search ............. 438/455, 438/458; 257/617
See application file for complete search history.

(56) References Cited

U.S. PATENT DOCUMENTS

| | | | |
|---|---|---|---|
| 6,303,412 B1 * | 10/2001 | Park ........................ | 438/149 |
| 6,316,333 B1 * | 11/2001 | Bruel et al. ............... | 438/458 |
| 6,544,862 B1 * | 4/2003 | Bryan ...................... | 438/455 |
| 6,566,198 B2 * | 5/2003 | Park et al. ................ | 438/259 |
| 6,884,702 B2 * | 4/2005 | Wei et al. ................. | 438/514 |
| 6,924,517 B2 * | 8/2005 | Chen et al. ............... | 257/213 |
| 7,179,719 B2 * | 2/2007 | Droes et al. .............. | 438/458 |
| 7,250,351 B2 * | 7/2007 | Furukawa et al. ......... | 438/423 |
| 2001/0020722 A1 * | 9/2001 | Yang ........................ | 257/347 |
| 2005/0227498 A1 * | 10/2005 | Furukawa et al. ......... | 438/758 |

* cited by examiner

*Primary Examiner*—Andy Huynh
*Assistant Examiner*—David Goodwin
(74) *Attorney, Agent, or Firm*—Law Office of Gerald Maliszewski; Gerald Maliszewski

(57) ABSTRACT

A hydrogen (H) exfoliation gettering method is provided for attaching fabricated circuits to receiver substrates. The method comprises: providing a Si substrate; forming a Si active layer overlying the substrate with circuit source/drain (S/D) regions; implanting a p-dopant into the S/D regions; forming gettering regions underling the S/D regions; implanting H in the Si substrate, forming a cleaving plane (peak concentration (Rp) H layer) in the Si substrate about as deep as the gettering regions; bonding the circuit to a receiver substrate; cleaving the Si substrate along the cleaving plane; and binding the implanted H underlying the S/D regions with p-dopant in the gettering regions, as a result of post-bond annealing.

16 Claims, 7 Drawing Sheets

HYDROGEN

HOST SUBSTRATE (GLASS)

CLEAVED SILICON SUBSTRATE ACTIVE DEVICE

RELATED APPLICATIONS

This application is a Divisional Application of a patent application entitled, SYSTEM AND METHOD FOR HYDROGEN EXPOLIATION GETTERING, invented by Droes et al., Ser. No. 10/991,120, filed Nov. 16, 2004, now U.S. Pat. No. 7,183,179 which is a continuation-in-part of a pending application entitled SYSTEM AND METHOD FOR HYDROGEN EXFOLIATION, invented by Droes et al, filed on Sep. 28, 2004, Ser. No. 10/953,938, now U.S. Pat. No. 7,179,719 both of which are incorporated herein by reference.

BACKGROUND OF THE INVENTION

1. Field of the Invention

This invention generally relates to integrated circuit (IC) fabrication and, more particularly, to a method for transferring partially completed circuits from silicon substrates, to temperature sensitive substrates, for liquid crystal display (LCD) applications.

2. Description of the Related Art

There is broad agreement in the flat panel display (FPD) industry that system-on-glass (SOG) technology is a natural evolutionary step for flat panel displays, especially for mobile devices. In fact, SOG is a natural confluence of display and microprocessor evolution because integration is a proven solution for greatly reducing costs, while improving the compactness and reliability of electrical systems.

Display modules have received some enhanced functionality, like display drivers and analog-to-digital converters, thanks to low-temperature polysilicon (LTPS) technology. Conventionally, the best means for achieving adequate LTPS performance for SOG devices at a competitive cost is the crystallization of a thin amorphous layer of silicon with a laser beam. Unfortunately, this approach remains relatively expensive, even years after being introduced to LCD production. Moreover, even if polysilicon thin film transistors (TFTs) can be efficiently produced using this method, it is unlikely that they have sufficient capability to realize some sophisticated functions like CPU operations, digital driver LCDC, digital-to-analog converter (DAC), memory, graphical controller, wireless, MPU, and digital signal processing. Finally, the steadiness of drive currents produced by poly-Si TFTs may be inadequate for new technologies such organic electroluminescent displays.

There are two major problems that prevent the integration of the above-mentioned functions into integrated LCD products. One is the film quality, and the other is the design limitations associated with glass substrates. The poly-Si created by laser annealing consists of numerous small grains, with a typical size of less than 1 micron. Each grain is oriented differently and surrounded by grain boundaries, which cause degradation in the resultant device characteristics. Further, the poly-Si TFT device characteristics are not uniform. The problem with the small, non-uniform grain size is compounded by the fact the energy-producing operations that can address this problem are limited by the sensitivity of LCD substrates to high temperatures.

In short, the convolution between cost and performance of polysilicon devices still pales compared to that of single-crystal silicon (c-Si). The trouble is in creating quality thin films of c-Si on transparent or flexible substrates, which usually are made of materials other than silicon. Other solutions to this hybrid field problem include Fluidic-Self-Assembly™ (FSA) by Alien Technology. FSA works fairly well for plastic substrates and semiconductor blocks thicker than 50 microns. Unfortunately, FSA placement depends on random probability and gravity. Because the probability of successful placement is small (<<20%), a large amount of blocks are needed. Also, as the blocks get smaller, Brownian motion becomes more disruptive to precise placement and more time is required for settlement. Finally, if glass substrates are desired, then another problem is the efficient etching of precise-sized holes. Other rapid assembly techniques, like capillary self-assembly, still require fluid, which usually demands use of surfactants, and remain susceptible to Brownian motion.

SOITEC and other researchers have developed and refined a means of efficiently creating thin films of c-Si by ion-cutting with a high dose hydrogen implantation. In related work, Joly et al. have extended the ion-cutting process (Smart-Cut) to produce devices on one substrate, and transfer these devices to a different substrate. While their work describes a process for transferring the devices, there is little discussion regarding the impact of high dose hydrogen implantation on device performance. It is acknowledged by many that the required large doses of hydrogen (~$5e^{16}$ atoms/cm$^2$) can result in highly defective regions in the transferred silicon films.

FIG. 1 is a diagram of a hydrogen-induced cleaving process using a hydrogen blocking mask (prior art). To address some of the problems associated with the use of hydrogen, Bruel et al., describe the use of a blocking mask to protect active silicon regions from damage during the hydrogen implant. A blocking mask adds an extra step to the fabrication process. However, if hydrogen is allowed to diffuse into the substrate near the channel areas, then dopants in the channel and source/drain regions may bind with the hydrogen and impact the performance of the transistor. Therefore, conventional processes have not proved to be practical for large-scale fabrication processes, or for the transfer of very large active Si areas, such as VLSI circuits with a plurality of blocked areas.

It would be advantageous if an improved substrate cleaving processes were developed that minimized the detrimental effects of hydrogen.

SUMMARY OF THE INVENTION

This application generally relates to processes for fabricating single-crystal silicon devices, cleaving the devices from a substrate, and placing them on glass substrates suitable for making hybrid devices. More particularly, the application relates to the transfer of partially completed VLSI circuits from single-crystal silicon substrates to glass panels for the production of flat panel displays. The process can be used to place partially completed VLSI crystalline silicon devices onto non-silicon substrates for the purpose of making large area devices, especially display systems, such as a display matrix, complementary signal devices, and control circuitry.

This application addresses the problems associated with presence of hydrogen that may remain as a result of the substrate cleaving process. The problem is solved by implanting a region of p-dopant near the active regions, to act as a hydrogen gettering layer. Furthermore, any hydrogen in the channel region due to implantation, though at a lower concentration than at the cleaving plane, is also gettered by p-dopant near the S/D regions. As such, the hydrogen concentration in the channel is lower than in other regions where p-dopant is implanted. The decreased level of hydrogen in these areas reduces the extent of p-dopant deactivation.

Accordingly, a hydrogen (H) exfoliation gettering method is provided for attaching fabricated circuits to receiver substrates. The method comprises: providing a Si substrate; forming a Si active layer overlying the substrate with circuit S/D regions; implanting a p-dopant into the S/D regions; forming p-dopant gettering regions underling the S/D regions; implanting H in the Si substrate, forming a cleaving plane (peak concentration (Rp) H layer) in the Si substrate about as deep as the p-dopant gettering regions; bonding the circuit to a receiver substrate; cleaving the Si substrate along the cleaving plane; and binding the implanted H underlying the S/D regions with p-dopant in the p-dopant gettering regions, as a result of post-bond annealing. More specifically, binding the implanted H with p-dopant in the gettering regions includes: passivating p-dopant in the gettering regions; and minimizing the passivation of p-dopant in the S/D regions.

Typically, forming a Si active layer overlying the substrate includes forming a channel region with p-dopant dopant, interposed between the S/D regions. Then, forming gettering regions includes forming gettering regions adjacent the channel region, minimizing the passivation of p-dopant in the channel region.

Additional details of the above-described method and an active Si device cleaved from a silicon substrate are provided below.

DETAILED DESCRIPTION

Figure 2A:
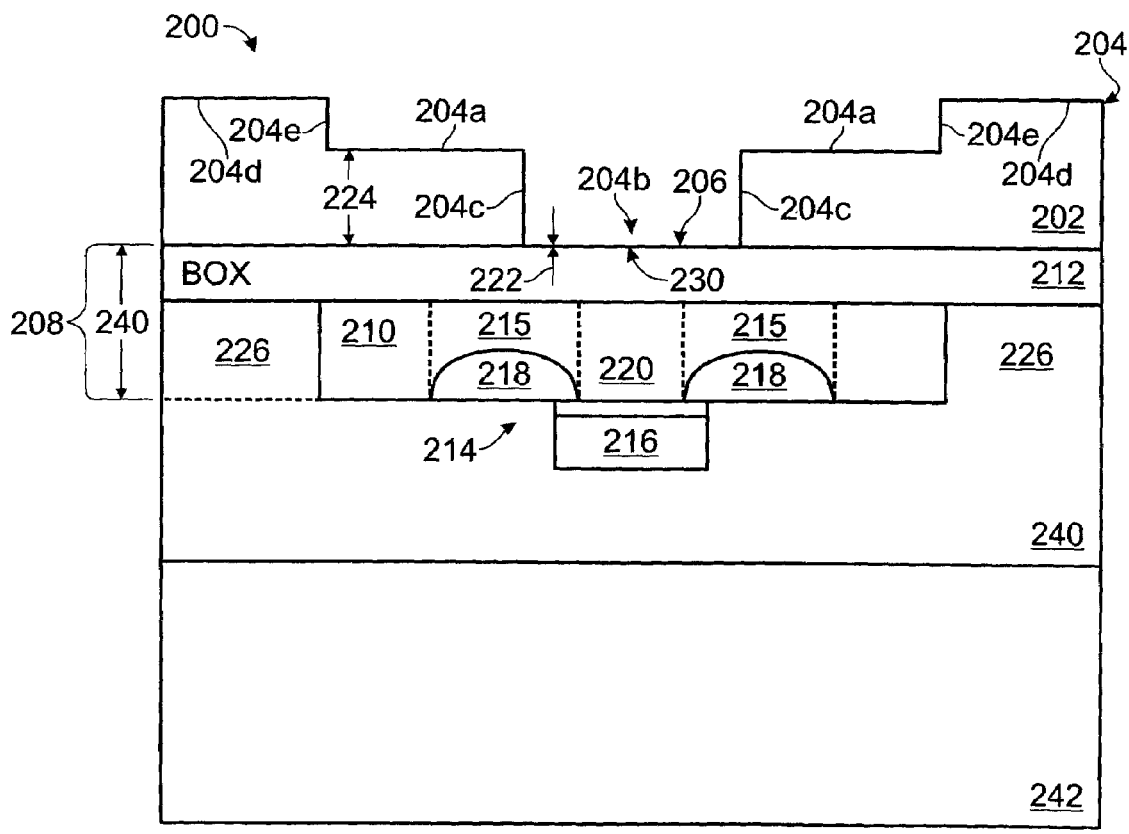
FIG. 2A is a partial cross-sectional view of an active Si device cleaved from a silicon-on-insulator (SOI) substrate.

FIG. 2A is a partial cross-sectional view of an active Si device cleaved from a silicon-on-insulator (SOI) substrate. The active Si device 200 comprises a Si substrate 202 with a cleaving plane surface 204 and a bottom surface 206. A SOI substrate 208 includes a buried oxide layer (BOX) between a Si active layer 210 and Si substrate bottom surface 206. A circuit 214 is formed in the Si active layer 210. P-dopant gettering regions 215, referred to herein as gettering regions, are formed in the Si active layer 210, underlying the S/D regions. As shown, the circuit 214 in the Si active area 210 is a transistor or TFT. The TFT 214 includes a gate 216, channel region 220, and source/drain (S/D) regions 218 adjacent the channel region 220. Alternately but not shown, the circuit 214 in the Si active layer 210 can be any CMOS circuit or VLSI device (with many TFT or CMOS circuits) using a p-doped semiconductor material.

The Si substrate cleaving plane surface 204 includes a first thickness surface 204a in areas underlying the S/D regions 218, a second thickness surface 204b, where the second thickness is less than the first thickness, in areas underlying the channel region 220. The cleaving plane surface 204 also includes vertical plane surfaces 204c formed between the areas of first and second thickness surfaces. The gettering regions 215 are formed in the Si active layer 210, between the first thickness surface 204a and the S/D regions 218. The Si substrate cleaving plane first thickness 224 is in the range of 20 to 1000 nanometers. The Si substrate cleaving plane second thickness 222 is in the range of 0 to 1000 Å. Also shown is a third thickness surface 204d underlying the field regions 226. Vertical plane surfaces 204e are formed between the areas of the second and third thickness surfaces 204b and 204d. As shown, the second thickness 222 is approximately zero. That is, the second thickness surface 204b is formed on the surface 230 of the BOX.

The Si substrate first thickness surface 204a includes a peak concentration of hydrogen (H), and the second thickness surface 204b includes a minimum concentration of H. The S/D regions 218 and channel region 220 include a p-dopant. That is, the S/D regions 218 and channel regions 220 are p-doped. The gettering regions 215 include H-passivated p-dopant. The p-dopant may be boron (B), gallium (Ga), indium (In), or aluminum (Al). Note, the p-dopant in the S/D regions 218 and channel 220 need not necessarily be the same p-dopant as is used to form gettering regions 215. In one aspect, the gettering regions 215 include a p-dopant dosage of in the range of $1 \times 10^{19}$ to $5 \times 10^{20}$ atoms/cm$^3$. The Si substrate first thickness surface 204a has a peak concentration of hydrogen in the range of $5 \times 10^{15}$ to $5 \times 10^{17}$.

Figure 1:
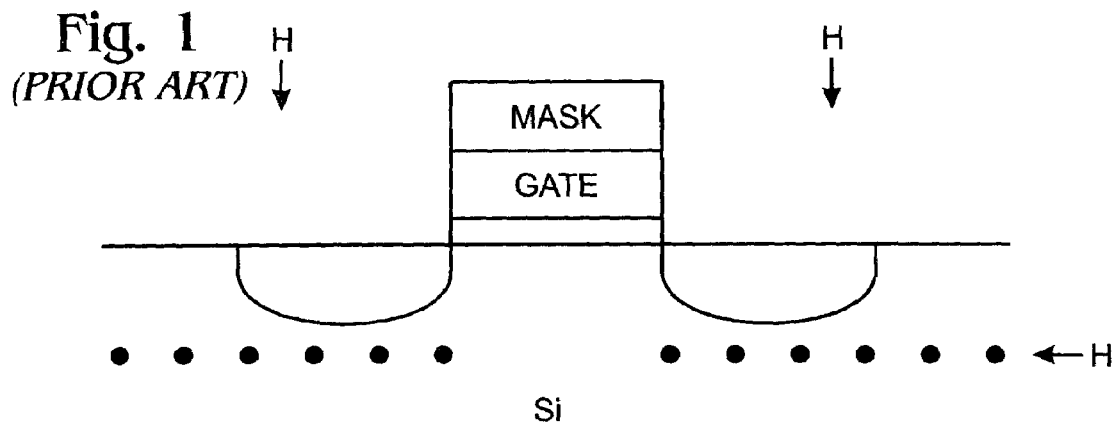
FIG. 1 is a diagram of a hydrogen-induced cleaving process using a hydrogen blocking mask (prior art).

Any concentrations of H that remain in the Si active layer 210 after the cleaving process, react with the p-dopant in the gettering regions 215. This prevents the H from reacting with the p-dopant in the S/D regions 218 and the channel region 220. Substantially less H exists in the active Si layer 210 underlying the channel region 220 because of the blocking effect of the gate 216. Although not shown, a temporary H blocking mask is used during the H implant, overlying the channel region 220 (and gate 216), similar to the mask shown in FIG. 1.

A planarized oxide layer 240 overlies the active Si layer circuit 214. A receiver substrate 242, made from a material such as glass, plastic, quartz, or metal foil is directly bonded to the oxide layer 240.

Figure 2B:
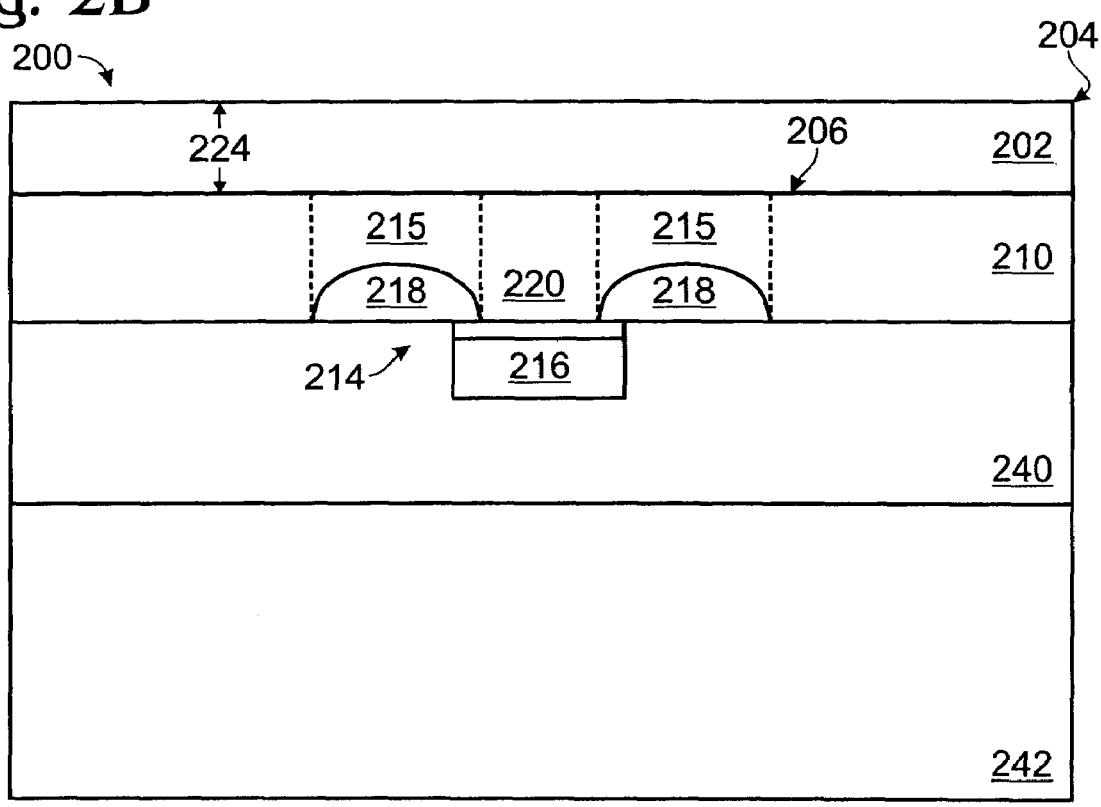
FIG. 2B is a partial cross-sectional view of an active Si device cleaved from a silicon substrate.

FIG. 2B is a partial cross-sectional view of an active Si device cleaved from a silicon substrate. For example, a bulk Si substrate may be used. A Si substrate 202 has a cleaving plane surface 204 and a bottom surface 206. An active layer 210 overlies the Si substrate bottom surface 206. A circuit 214 is formed in the Si active layer 210. Again, the circuit 214 is shown to be a TFT or transistor. However, the circuit can also represent a portion of a CMOS or VLSI circuit. Gettering regions 215 are formed underling the S/D regions, in the Si active layer. Thus, the circuit 214 in the Si active area 210 includes a channel region 220, and source/drain (S/D) regions 218 adjacent the channel region 220. The gettering regions 215 are formed in the Si active layer 210 between the cleavage plane 204 and the S/D regions 218.

The S/D regions 218 and channel region 220 include a p-dopant, and the gettering regions 215 include H-passivated p-dopant. Alternately stated, the gettering regions 215 include p-dopant-passivated hydrogen. A planarized oxide layer 240 overlies the active Si layer circuit 214. A receiver substrate 242, made from a material such as glass, plastic, quartz, or metal foil is directly bonded to the oxide layer 240.

The Si substrate has a thickness 224 between the cleaving plane 204 and the bottom surface 206 that is in the range of 20 to 1000 nanometers. The gettering regions 215 include a dosage of p-dopant in the range of $1 \times 10^{19}$ to $5 \times 10^{20}$ atoms/cm$^3$. The Si substrate cleavage plane 204 has a peak concentration of hydrogen in the range of $5 \times 10^{15}$ to $5 \times 10^{17}$. As in the device of FIG. 2A, the gettering regions 215 include a p-dopant such as boron, gallium, indium, or aluminum.

FUNCTIONAL DESCRIPTION

The fabrication of single-crystal silicon devices on glass substrates, using a hydrogen cleaving process, may result in an interaction of hydrogen and boron in the final devices. For example, a silicon wafer is first implanted with hydrogen so that the peak concentration (Rp) is located well below the silicon surface, for example 0.5 to 1.0 microns (um). The silicon substrate is then bonded directly to a glass substrate.

When the bonded pair is heated (>400° C.), hydrogen forms small platelets and causes the silicon to exfoliate in a single layer at the Rp.

Using this method to transfer partially completed CMOS devices to glass substrates, it is possible that hydrogen may interact with the p-dopant in the devices to cause device failure. Specifically, after transferring the devices to the glass substrate, a high temperature anneal is required (~650° C.). This causes diffusion of the remaining hydrogen in the silicon, and interaction with a p-dopant such as boron. Boron is noted to effectively getter hydrogen. Conventionally, when hydrogen and boron interact, the hydrogen effectively de-activates the boron dopants in the channel regions and source/drain regions.

Figure 3A:
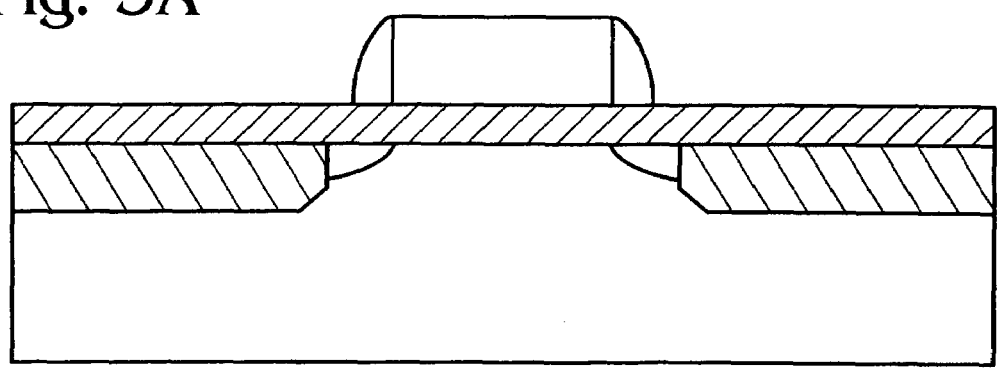
FIGS. 3A through 5B illustrate steps in the formation of an active device cleaved from a Si substrate, having H gettering regions.
Figure 3B:
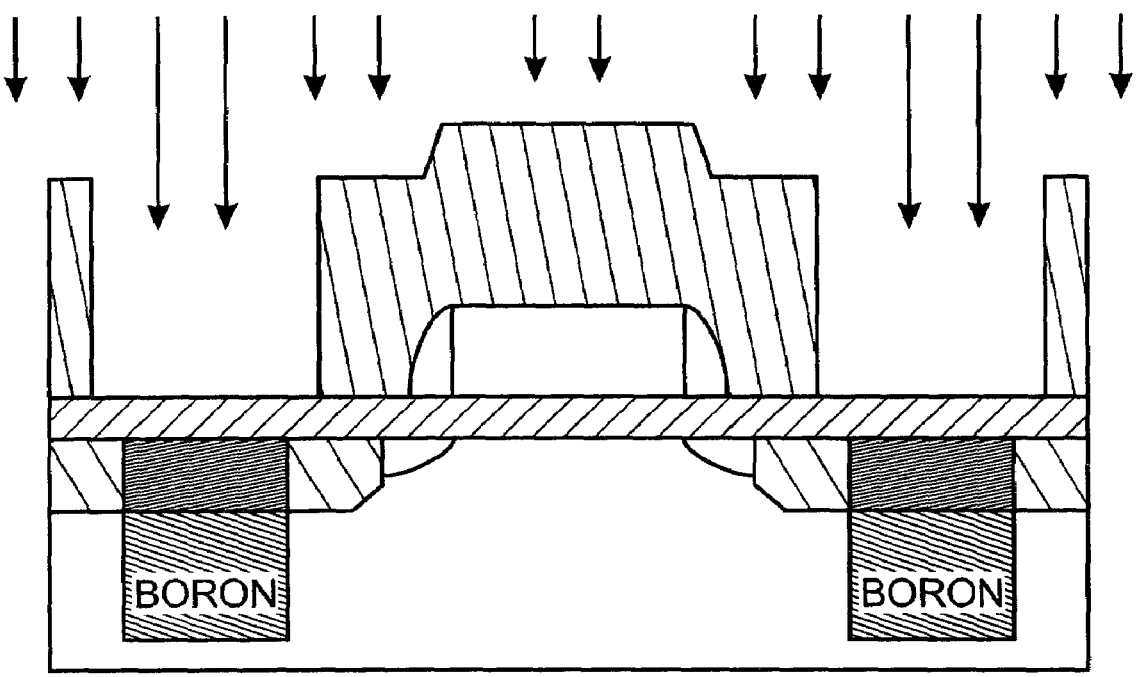

FIGS. 3A through 5B illustrate steps in the formation of an active device cleaved from a Si substrate, having H gettering regions. Details of the hydrogen exfoliation and gettering process follow. FIGS. 3A and 3B are partial cross-sectional views following the performance of Steps 1 and 2, respectively.

1. Begin with a conventional MOSFET process, up to the gate and source/drain formation. HALO and lightly doped drain (LDD) processes may be required for short channel length (L) devices.

2. Next, implant boron (for example) into selected areas of the S/D regions. For N-channel devices, the concentration of boron will be lower than the N+ concentration of the source/drain regions. This ensures that the source/drain regions retain their N+ characteristics. The concentration of boron in the implanted region ranges from 1E19 atoms/cm$^3$ to 5E20 atoms/cm$^3$. The lower limit of boron implantation is determined by the extent of hydrogen gettering. Since N+ region formation requires N+ impurity concentrations sufficiently higher than that of boron, the upper limit of B implantation is determined by N+ source/drain formation.

Figure 4A:
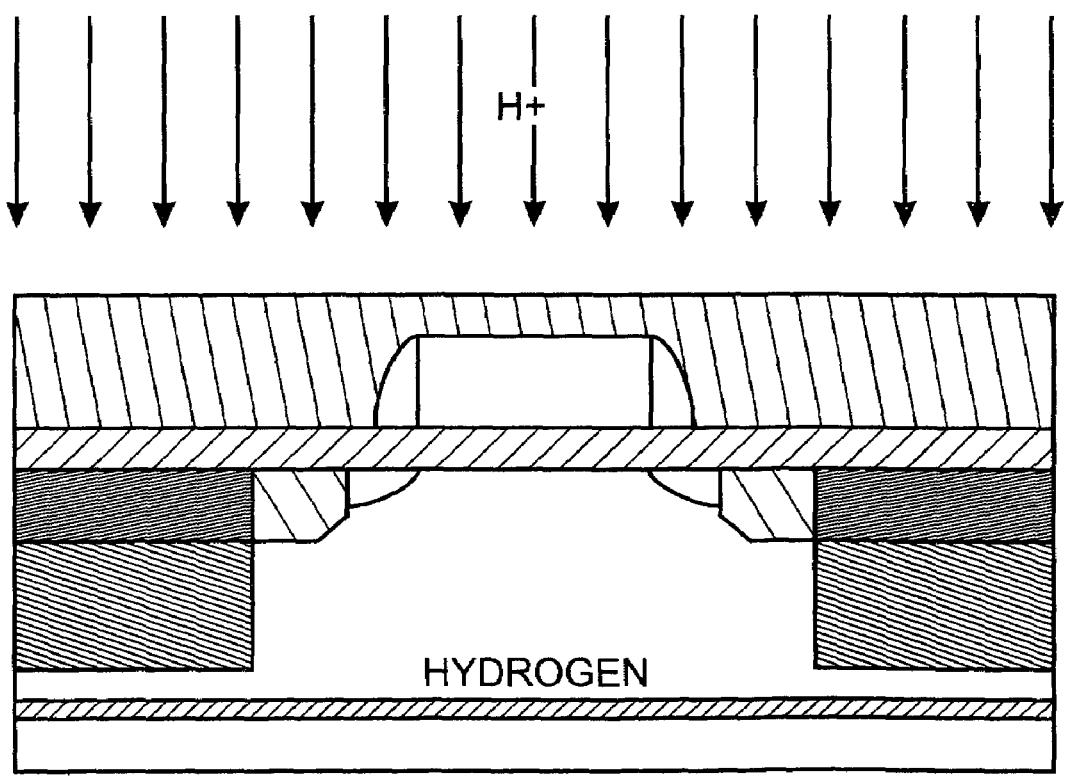
Figure 4B:
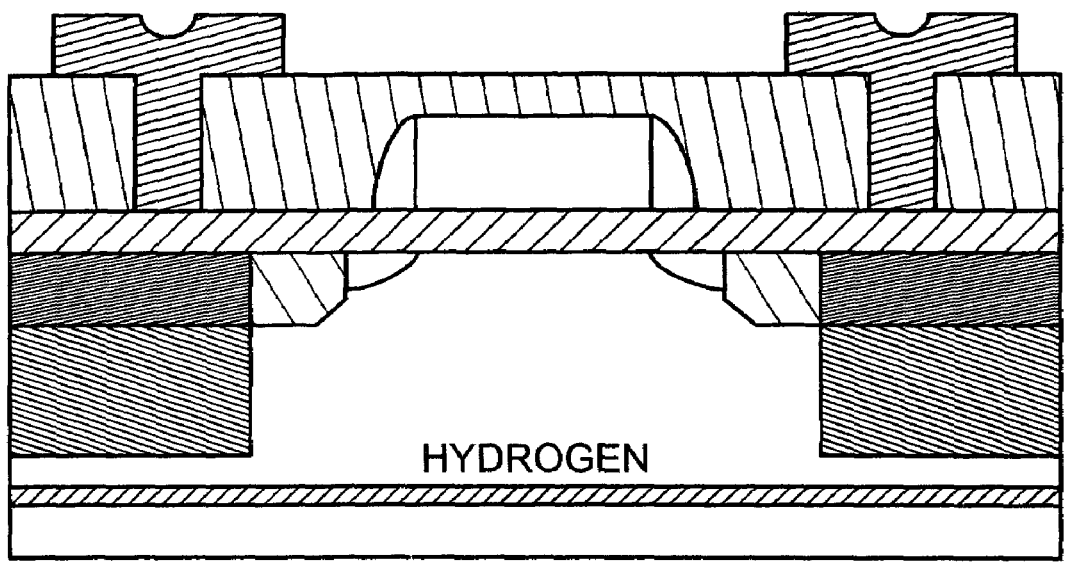

FIGS. 4A and 4B are cross-sectional views following the performance of Steps 3 and 4, respectively.

3. Deposit additional SiO2 layer and flatten the surface. Implant H+ slightly deeper than boron.

4-5. After metal layer formation (STEP4), bond to the host substrate (such as glass substrate) and cleave at the hydrogen-implanted interface by annealing. (STEP5)

Figure 5A:
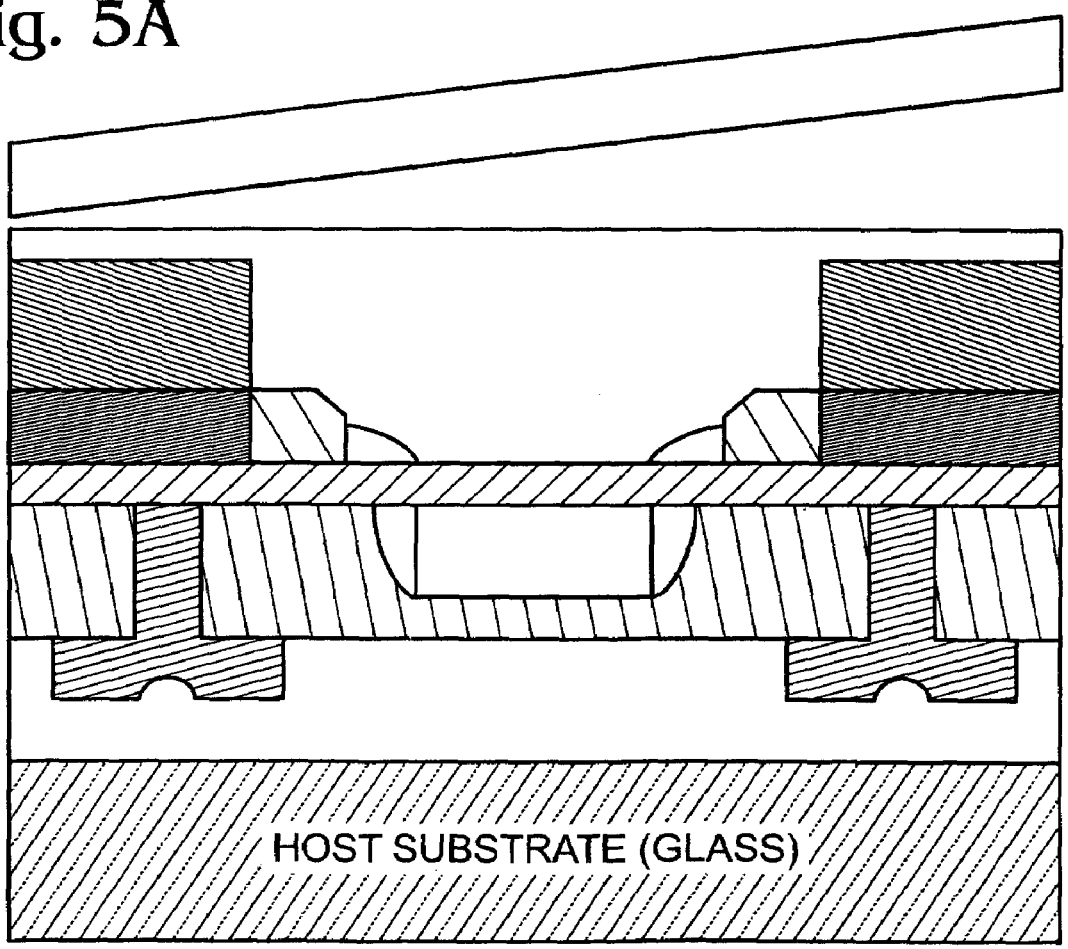
Figure 5B:
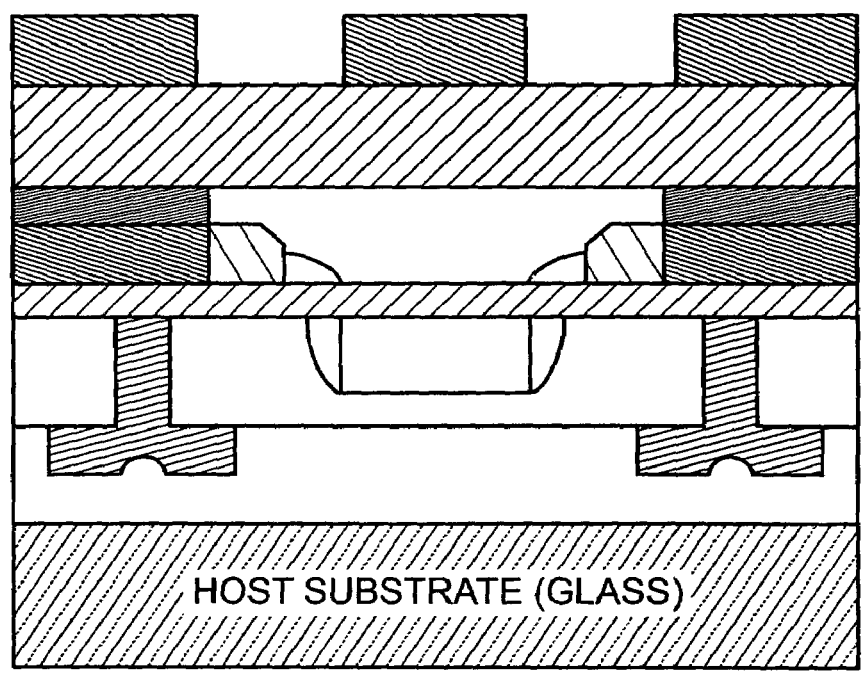

FIGS. 5A and 5B are cross-sectional views following the completion of Steps 5 and 6, respectively.

6. The Si layer is thinned down to remove the damaged region of the H+ implantation. Interlayer dielectric material is deposited (such as SiO2), contact holes are formed, and the TFT structure is completed.

Figure 6:
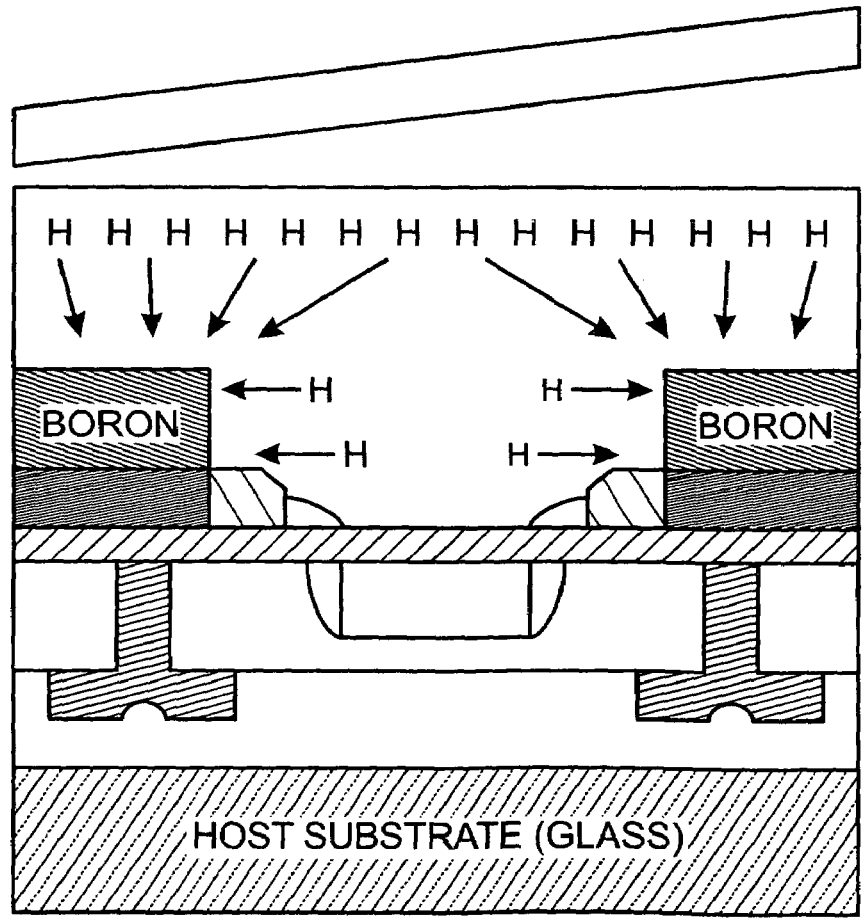
FIG. 6 is a partial cross-sectional view of the hydrogen gettering process.

FIG. 6 is a partial cross-sectional view of the hydrogen gettering process. As mentioned earlier, hydrogen in the channel region causes a degradation of the device characteristics. This includes de-activation of the channel and HALO dopants. After hydrogen implantation, most of the implanted hydrogen is located near the projected range (Rp). During the cleaving anneal, hydrogen at Rp diffuses to the channel area. In this example, the boron underlying the S/D regions acts as a gettering site for hydrogen. Furthermore, hydrogen near the channel region resulting from implantation, though at a lower concentration than the Rp H concentration, is also gettered by boron underlying the S/D regions. As such, the hydrogen concentration near the channel is low. The decreased level of hydrogen in areas near the channel and S/D regions reduces the extent of boron deactivation.

Since the device created by this invention has low hydrogen concentration in the channel area, the device performance is not degraded due to boron deactivation via hydrogen. Thus, the transferred device performs comparably to a device fabricated (but not cleaved) from a single-crystal Si substrate.

Figure 7A:
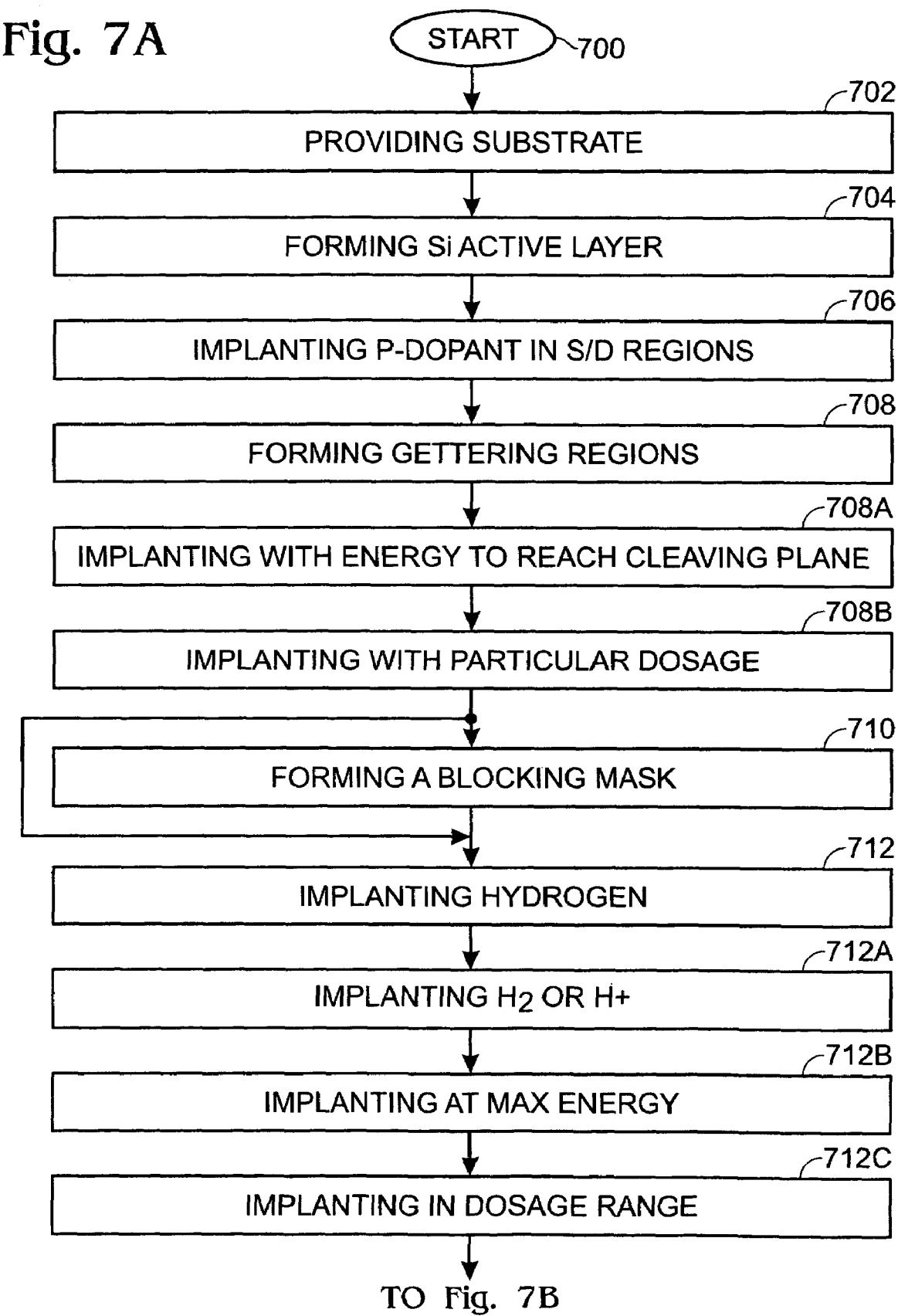
FIGS. 7A and 7B are flowcharts illustrating a hydrogen exfoliation gettering method for attaching fabricated circuits to receiver substrates.
Figure 7B:
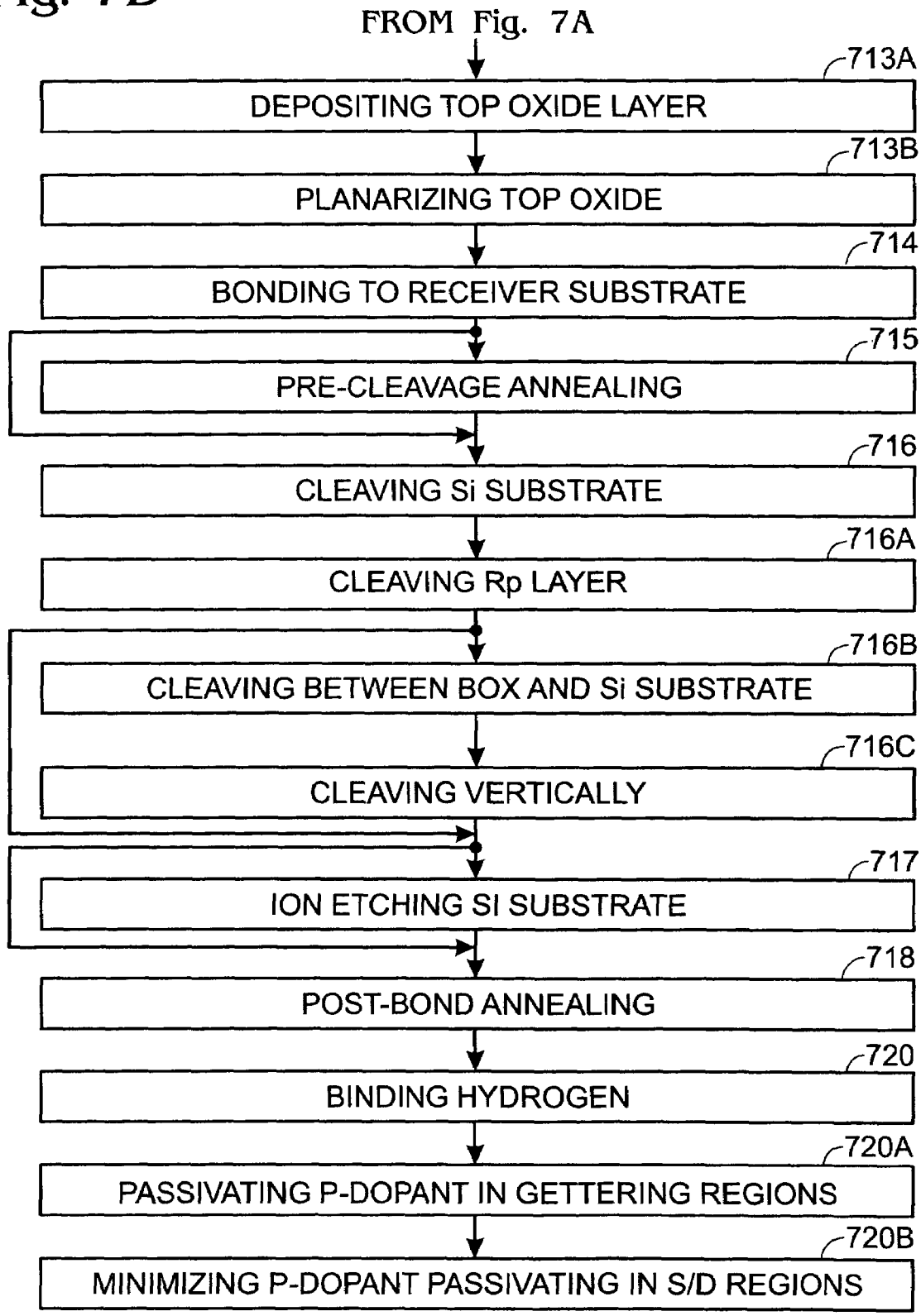

FIGS. 7A and 7B are flowcharts illustrating a hydrogen exfoliation gettering method for attaching fabricated circuits to receiver substrates. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 702 provides a Si substrate. Step 704 forms a Si active layer overlying the substrate with circuit source/drain (S/D) regions. Step 706 implants a p-dopant into the S/D regions. Step 708 forms p-dopant gettering regions underling the S/D regions. The p-dopant can be B, Ga, In, or Al. In one aspect, Step 708 is performed simultaneously with implanting p-dopant in the S/D regions (Step 706). However, Steps 706 and 708 need not necessarily be performed simultaneously. Further, the dopant used in the two steps need not necessarily be the same. Alternately stated, Step 708 forms gettering regions in a Si active layer underlying a circuit formed in the Si active layer. Step 712 implants H in the Si substrate, forming a cleaving plane in the Si substrate about as deep as the gettering regions. Step 714 bonds the circuit to a receiver substrate. Step 716 cleaves the Si substrate along the cleaving plane. Step 718 post-bond anneals the Si substrate. Step 720 binds the implanted H underlying the S/D regions with p-dopant in the gettering regions. Typically, the H-binding results from the annealing in Step 718. For example, Step 718 may anneal the Si substrate at a temperature in the range of 400 to 600 degrees C.

In some aspects, binding the implanted H with p-dopant in the B gettering regions in Step 720 includes substeps. Step 720A passivates p-dopant in the gettering regions. Alternately stated, the p-dopant in the gettering regions passivates H. Step 720B minimizes the passivation of p-dopant in the S/D regions.

In one aspect, forming a Si active layer overlying the substrate in Step 704 includes forming a channel region with p-dopant, interposed between the S/D regions. Then, forming gettering regions in Step 708 includes forming gettering regions adjacent the channel region, and Step 720 minimizes the passivation of p-dopant in the channel region. Alternately, forming circuit S/D regions in the Si active layer (Step 704) includes forming a VLSI or CMOS device.

In a different aspect, forming circuit S/D regions in the Si active layer (Step 704) includes forming a circuit at process temperatures greater than 600 degrees C. Then, Step 714 bonds the circuit to a temperature-sensitive carrier substrate such as glass, plastic, quartz, or metal foil.

In another aspect, forming a cleaving plane in Step 712 includes forming a peak concentration (Rp) H layer in the Si substrate. Then, Step 716 cleaves the Si substrate along the Rp layer. In one aspect, implanting H in the Si substrate (Step 712) includes substeps. Step 712A implants H in a form selected from the group including H+ and H2. Step 712B implants at a maximum energy of 1 MeV. Step 712C implants at a dosage in the range of $5 \times 10^{16}$ to $5 \times 10^{17}$.

In one aspect Step 713A, following the H implanting (Step 712), deposits a top oxide layer overlying the circuit. Step 713B planarizes the top oxide layer. Then, Step 714 directly bonds the top oxide layer to the receiver substrate.

In another aspect, Step 715 pre-cleavage anneals the substrate. Then, Step 716 cleaves in response to pre-cleavage annealing the Si substrate. For example, in one variation Step 712 implants H in the substrate to the same depth as the furthest penetration of the gettering regions. Annealing the Si substrate in Step 715 includes annealing at a temperature in the range of 200 to 300 degrees C. Then, Step 716 cleaves in response to annealing the Si substrate. Alternately, Step 716 cleaves the Si substrate in response to a mechanical separation process (Step 715 is not performed). In one aspect, following the cleaving of the Si substrate, Step 717 using an ion etch technique, removes any remaining Si substrate material.

In another aspect, forming gettering regions in the Si substrate (Step 708) includes substeps. Step 708A implants p-dopant with an energy sufficient to penetrate to the level of the cleaving plane. Step 708B implants at a dosage in the range of $1\times10^{19}$ to $5\times10^{20}$ atoms/cm$^3$.

In one aspect, providing a silicon Si substrate in Step 702 includes forming a Si-on-insulator (SOI) substrate with a buried oxide (BOX) layer. Then, Step 710 forms a (temporary) blocking mask overlying the channel region. Implanting H in the Si substrate in Step 712 includes: implanting H into the S/D regions, but not the channel region underlying the blocking mask; and following the H implantation, removing the blocking mask.

In the SOI aspect, forming a cleaving plane in the Si substrate in Step 712 includes forming a horizontal peak concentration (Rp) H layer in regions of the Si substrate underlying the S/D regions. Then, cleaving the Si substrate in Step 716 includes substeps. Step 716A cleaves a first region along the horizontal Rp layer in the regions underlying the S/D regions. Step 716B cleaves a second region along a horizontal interface between the BOX layer and Si substrate underlying the channel region. Step 716C cleaves vertically between the first and second regions.

A hydrogen exfoliation gettering process and an active Si device formed from using the process have been presented. Specific process details and materials have been used as examples to illustrate the invention. However, the invention is not limited to merely these examples. Other variations and embodiments of the invention will occur to those skilled in the art.

We claim:

1. An active silicon (Si) device cleaved from a silicon substrate, the active Si device comprising:
   a Si substrate with a post-cleaving plane surface including impurities of a first ion type, and a bottom surface;
   an active Si layer overlying the Si substrate bottom surface;
   a circuit formed in the Si active layer;
   gettering regions underlying the Si active layer, including a second ion type acting as a gettering agent for the first ion type;
   wherein the Si substrate is a Si-on-insulator (SOI) substrate with a buried oxide layer (BOX) between the Si substrate and the active Si layer;
   wherein the Si substrate post-cleaving plane surface includes:
      a first thickness surface in areas underlying the S/D regions;
      a second thickness surface, where the second thickness is less than the first thickness, in areas underlying the channel region; and
      vertical plane surfaces formed between the areas of first and second thickness surfaces; and
   wherein the gettering regions are formed between Si substrate first thickness surface and the S/D regions.

2. The active Si device of claim 1 wherein the circuit in the Si active area includes a channel region, and source/drain (S/D) regions adjacent the channel region; and
   wherein the gettering regions are formed in the active Si layer.

3. The active Si device of claim 2 wherein the S/D and channel regions include a p-dopant; and
   wherein the first ion type comprises a p-dopant and the second ion type comprises hydrogen (H).

4. The active Si device of claim 1 further comprising:
   a planarized oxide layer overlying the active Si layer circuit;
   a receiver substrate, made from a material selected from the group including glass, plastic, quartz, and metal foil directly bonded to the oxide layer.

5. The active Si device of claim 1 wherein the circuit in the Si active layer is selected from the group including TFTs, CMOS circuits, and VLSI devices.

6. The active Si device of claim 1 wherein the second ion type comprises a p-dopant; and,
   wherein the gettering regions include p-dopant with a dosage in the range of $1\times10^{19}$ to $5\times10^{20}$ atoms/cm$^3$.

7. The active Si device of claim 1 wherein the first ion type comprises H; and,
   wherein the Si substrate post-cleaving plane includes a peak concentration of H in the, range of $5\times10^{15}$ to $5\times10^{17}$.

8. The active Si device of claim 1 wherein the second ion type comprises a p-dopant selected from the group including boron, gallium, indium, and aluminum.

9. The active Si device of claim 1 wherein the first ion type comprises H;
   wherein the Si substrate first thickness surface includes a peak concentration of H, and the second thickness surface includes a minimum concentration of H.

10. The active Si device of claim 9 further comprising:
    a temporary H blocking mask overlying the channel region.

11. The active Si device of claim 1 wherein the Si substrate post-cleaving plane first thickness is in the range of 20 to 1000 nanometers; and
    wherein the Si substrate post-cleaving plane second thickness is in the range of 0 to 1000 Å.

12. An active silicon (Si) device cleaved from a silicon substrate, the active-Si device comprising:
    a Si-on-insulator (SOI) substrate with a post-cleaving plane surface, a bottom surface, and a buried oxide layer (BOX) between the Si substrate bottom surface and the active Si layer, wherein the Si substrate post-cleaving plane surface includes:
       a first thickness surface in areas underlying source/drain (S/D) regions;
       a second-thickness surface, where the second thickness is less than the first thickness, in areas underlying-a channel region; and
       vertical plane surfaces formed between the areas of first and second thickness surfaces;
    an active Si layer overlying the BOX layer including the channel region and S/D regions adjacent the channel region;
    a circuit formed in the Si active layer; and
    gettering regions underlying the Si active layer.

13. The active Si device of claim 12 wherein the gettering regions are formed between Si substrate first thickness surface and the S/D regions.

14. The active Si device of claim 12 wherein the Si substrate first thickness surface includes a peak concentration of hydrogen (H), and the second thickness surface includes a minimum concentration of H.

15. The active Si device of claim 14 further comprising:
    a temporary H blocking mask overlying the channel region.

16. The active Si device of claim 12 wherein the Si substrate post-cleaving plane first thickness is in the range of 20 to 1000 nanometers; and
    wherein the Si substrate post-cleaving plane second thickness is in the range of 0 to 1000 Å.

* * * * *